United States Patent
Chang et al.

(10) Patent No.: US 12,322,646 B2
(45) Date of Patent: Jun. 3, 2025

(54) PASSIVATION LAYERS WITH ROUNDED CORNERS

(71) Applicant: Taiwan Semiconductor Manufacturing Company, Ltd., Hsinchu (TW)

(72) Inventors: Mingni Chang, Hsinchu (TW); Hsuan-Ming Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 387 days.

(21) Appl. No.: 17/690,556

(22) Filed: Mar. 9, 2022

(65) Prior Publication Data

US 2023/0290673 A1    Sep. 14, 2023

(51) Int. Cl.
  *H01L 21/768* (2006.01)
  *H01L 21/311* (2006.01)
  (Continued)

(52) U.S. Cl.
  CPC .. *H01L 21/76802* (2013.01); *H01L 21/31138* (2013.01); *H01L 21/76843* (2013.01);
  (Continued)

(58) Field of Classification Search
  CPC ........ H01L 2224/02311; H01L 21/768–76898; H01L 2224/023–024
  See application file for complete search history.

(56) References Cited

U.S. PATENT DOCUMENTS 11,222,859 B2    1/2022  Chien-Hao et al.
2019/0164917 A1*  5/2019  Huang .................. H01L 21/768
(Continued)

FOREIGN PATENT DOCUMENTS

TW  202125654 A    7/2021
TW  202143428 A    11/2021

OTHER PUBLICATIONS

Inayat, S.B., Nayak, A.P., Logeeswaran, V.J., Islam, M.S. (2015). Dry Etching Processes. In: Bhushan, B. (eds) Encyclopedia of Nanotechnology. Springer, Dordrecht. https://doi.org/10.1007/978-94-007-6178-0_353-2 (Year: 2015).*

*Primary Examiner* — Evren Seven
*Assistant Examiner* — Cole Leon Lindsey
(74) *Attorney, Agent, or Firm* — Sterne, Kessler, Goldstein & Fox P.L.L.C.

(57) ABSTRACT

The present disclosure describes a structure with passivation layers with rounded corners and a method for forming such a structure. The method includes forming a first insulating layer on a substrate, where the substrate includes a first conductive structure. The method further includes forming an opening in the first insulating layer to expose the first conductive structure and forming a second conductive structure on the first insulating layer, where the second conductive structure is in contact with the first conductive structure through the opening. The method further includes removing a portion of the second conductive structure with a first etching condition, removing a portion of the first insulating layer with a second etching condition, different from the first etching condition, to form a rounded corner between a sidewall of the second conductive structure and a top surface of the first insulating layer, and depositing a second insulating layer on the first insulating layer and the second conductive structure.

20 Claims, 9 Drawing Sheets

(51) Int. Cl.
*H01L 23/00* (2006.01)
*H01L 23/522* (2006.01)
*H01L 23/532* (2006.01)

(52) U.S. Cl.
CPC .... *H01L 23/5223* (2013.01); *H01L 23/53238* (2013.01); *H01L 24/03* (2013.01); *H01L 24/11* (2013.01); *H01L 24/13* (2013.01); *H01L 2224/02311* (2013.01); *H01L 2224/02331* (2013.01); *H01L 2224/0401* (2013.01); *H01L 2224/11019* (2013.01); *H01L 2924/35121* (2013.01)

(56) References Cited

U.S. PATENT DOCUMENTS

| | | |
|---|---|---|
| 2021/0098400 A1 | 4/2021 | Hsiang-Ku et al. |
| 2021/0375802 A1 | 12/2021 | Yi-An et al. |
| 2022/0336365 A1* | 10/2022 | Lee .................. H01L 21/76885 |

* cited by examiner

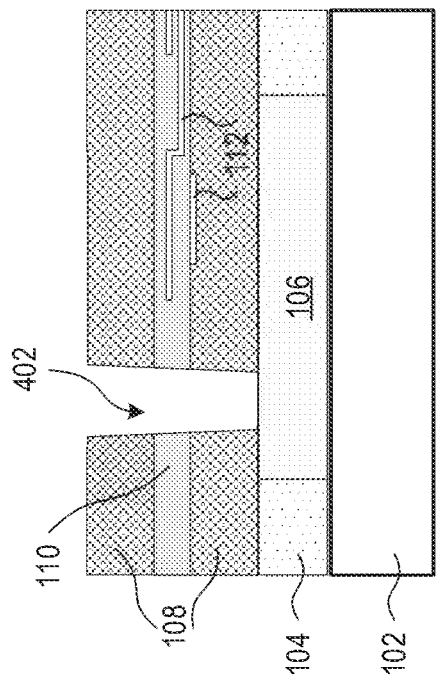
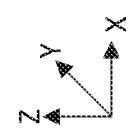
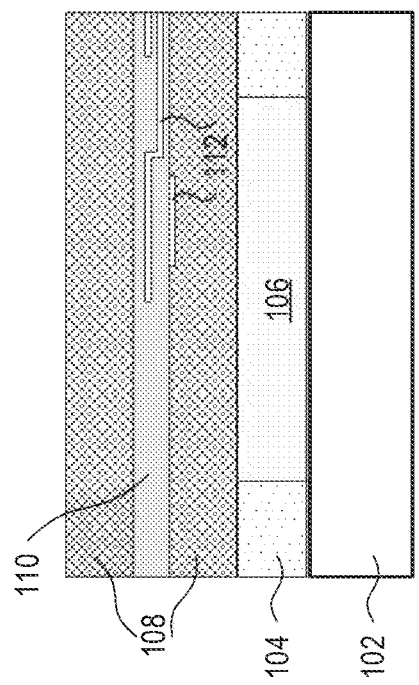
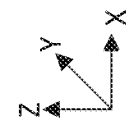

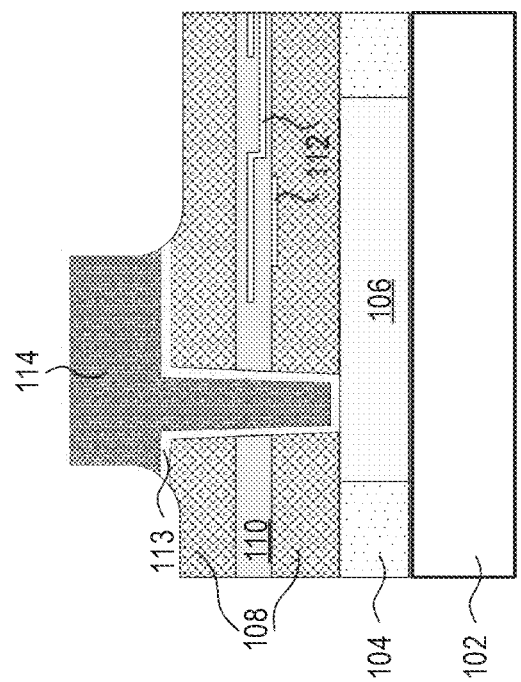
FIG. 7
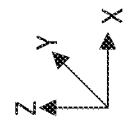
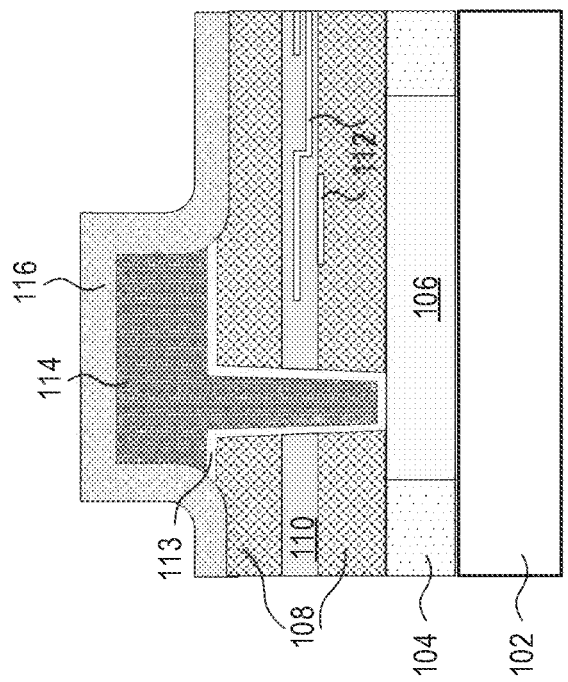
FIG. 8A
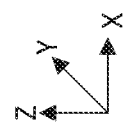

PASSIVATION LAYERS WITH ROUNDED CORNERS

BACKGROUND

Redistribution layers (RDLs) are formed within passivation layers in wafer level packaging (WLP) and integrated fan-out (InFO) packaging. With scaling down of semiconductor device sizes, the density of RDLs increases as well as the number of interfaces between the RDLs and the passivation layers.

BRIEF DESCRIPTION OF THE DRAWINGS

Aspects of the present disclosure are best understood from the following detailed description when read with the accompanying figures.

FIGS. 3-5, 6A-6C, 7, 8A, 8B, 9A, and 9B illustrate cross-sectional views of a semiconductor structure with passivation layers with rounded corners at various stages of its fabrication process, in accordance with some embodiments.

DETAILED DESCRIPTION

Figure 1A:
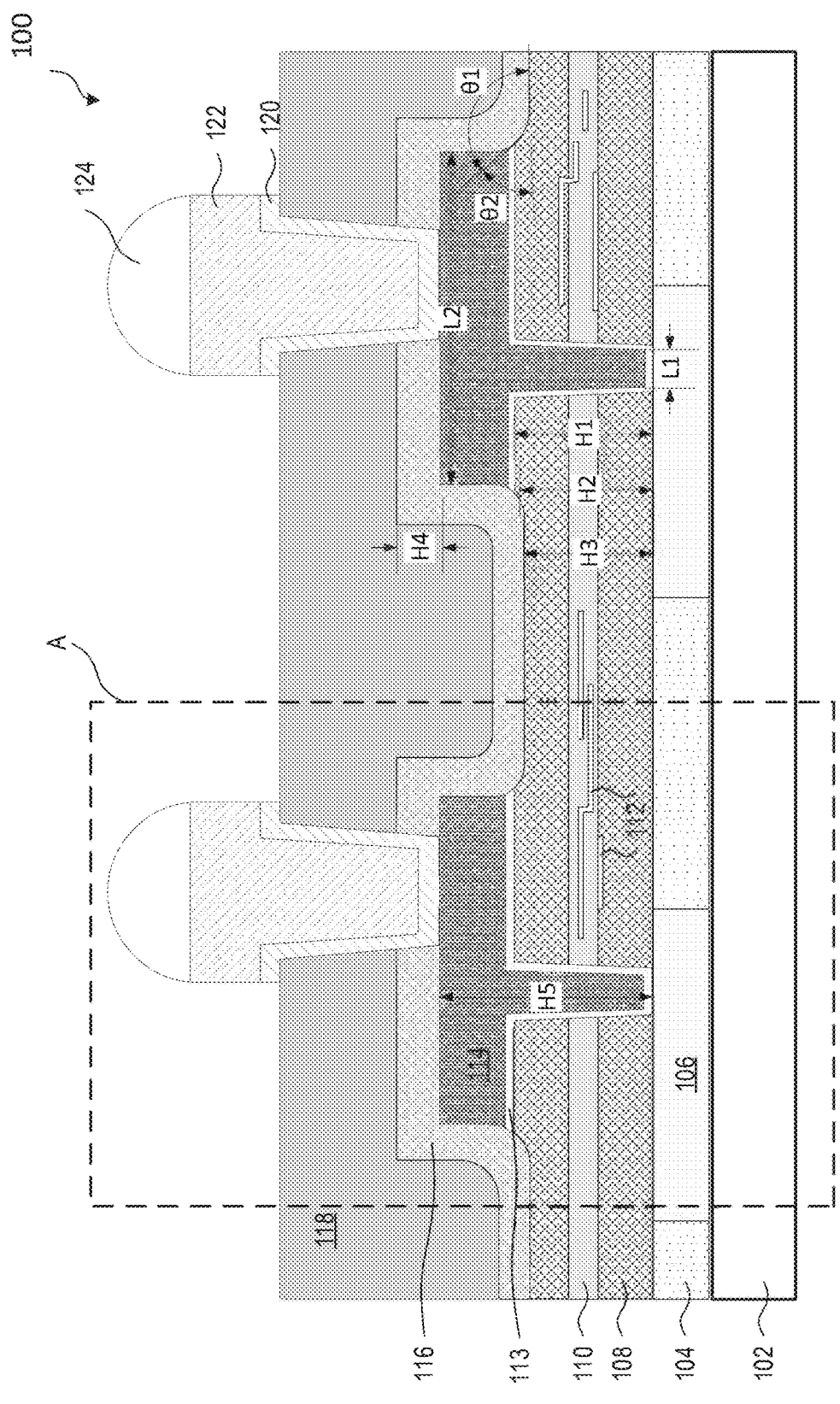
FIGS. 1A and 1B illustrate cross-sectional views of semiconductor structures with passivation layers with rounded corners, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1A, 1B, 3-5, 6A-6C, 7, 8A, 8B, 9A, and 9B with the same annotations applies to each other, unless mentioned otherwise.

Metal redistribution layers (RDLs) are formed within passivation layers, such as insulating layers, in wafer level packaging (WLP) and integrated fan-out (InFO) packaging. When a corner between the metal RDLs and the passivation layers is substantially sharp, for example, when an angle between a sidewall of the metal RDLs and a top surface of the passivation layers is a substantially right angle, cracks can develop around the corner. The cracks can propagate into the metal-insulator-metal (MIM) structures formed within the passivation layers, causing device failures. Polyimide layers, under-bump metallization (UBM) structures, and metal bumps can be formed on the passivation layers. The cracks can also cause delamination of the polyimide layers and the UBM structures, further causing device failures. With scaling down of semiconductor device sizes, the density of metal RDLs increases as well as the number of interfaces between the metal RDLs and the passivation layers. Therefore, the number of locations where cracks can occur and compromise device reliability increases.

The present disclosure provides example semiconductor structures (e.g., WLP structures and InFO structures) with passivation layers with rounded corners and a method for forming the passivation layers with rounded corners. A first passivation layer can be formed on an interlayer dielectric (ILD) layer formed on a substrate. The substrate can include transistors, contacts, and metallization layers. The ILD layer can include a top metallization (TME) layer. The first passivation layer can include MIM structures. An opening can be formed in the first passivation layer. A metal RDL can be formed in the opening. In some embodiments, a barrier layer can be formed before the metal RDL is formed. A portion of the metal RDL and the barrier layer can be removed by first etching conditions. The first etch can be anisotropic. For example, after the first etch, a sidewall of the metal RDL can be substantially vertical near the top but the sidewall can be slanted near the bottom. In some embodiments, the sidewall of the metal RDL can be slanted from the top to the bottom. In some embodiments, a blocking layer, such as a photoresist layer, can be used to define a shape of the metal RDL. After the blocking layer is removed, less metal RDL needs to be removed by the first etching conditions compared with the embodiment where no blocking layer is used.

A portion of the first passivation layer can be removed by second etching conditions, different from the first etching conditions. The second etch can be anisotropic. For example, after the second etch, a corner between a sidewall of the metal RDL and a top surface of the first passivation layer can be rounded but the top surface of the first passivation layer can be substantially flat farther from the corner. In some embodiments, the top surface of the first passivation layer can be slanted farther from the corner. In some embodiments, the corner between the sidewall of the metal RDL and the top surface of the first passivation layer can be between about 95° and about 135°. The rounded corners can reduce the formation of cracks. Less cracks can form and propagate into the MIM structures in the first passivation layer.

A second passivation layer can be formed on the first passivation layer and carry over the rounded corners to the second passivation layer. In some embodiments, a third passivation layer can be formed on the second passivation layer and carry over the rounded corners to the third passivation layer. The rounded corners within different passivation layers can reduce the cracks. A polyimide layer can be formed on the second passivation layer or the third passivation layer. A UBM opening can be formed through the polyimide layer, the second passivation layer, and/or the third passivation layer. A UBM structure can be formed in the UBM opening. A metal bump can be formed on the UBM structure and a solder cap can be attached to the metal bump. The rounded corners can also reduce delamination of the polyimide layer and the UBM structure, further improving device reliability. The passivation layers with rounded corners can reduce MIM and delamination defects, thus increasing reliability and lifetime of the WLP and InFO structures.

Figure 1B:
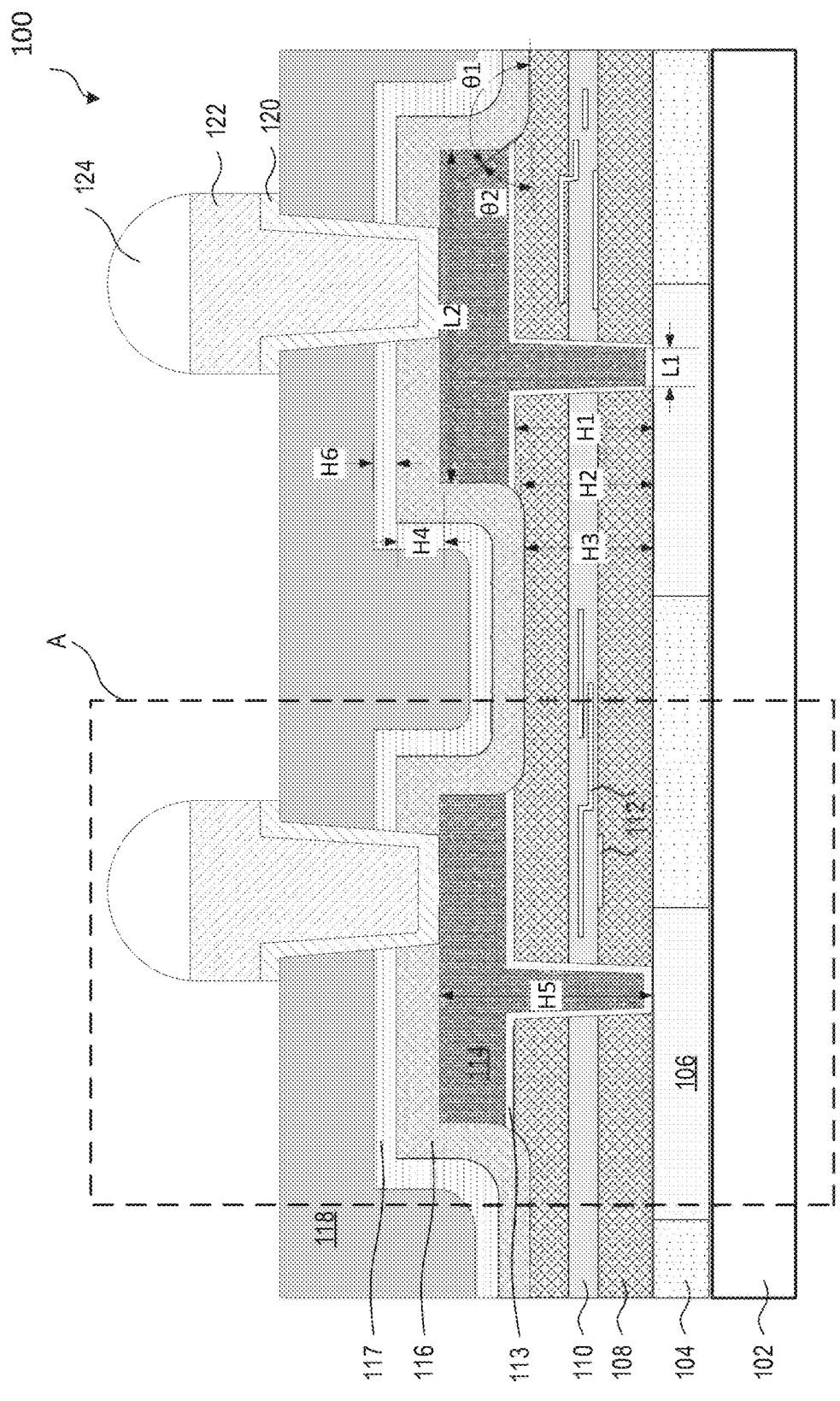

According to some embodiments, FIGS. 1A and 1B illustrate cross-sectional views of a semiconductor structure 100. In some embodiments, semiconductor structure 100 can represent a WLP structure 100 or an InFO structure 100. Semiconductor structure 100 can include a substrate 102, a dielectric layer 104, a TME layer 106, a first passivation layer 108, a dielectric layer 110, a MIM structure 112, a barrier layer 113, a metal RDL 114, a second passivation layer 116, a polyimide layer 118, a UBM structure 120, a metal bump 122, and a solder cap 124. In some embodiments, semiconductor structure 100 can further include a third passivation layer 117.

Referring to FIGS. 1A and 1B, substrate 102 can be a semiconductor material, such as silicon (Si), germanium (Ge), silicon germanium (SiGe), a silicon-on-insulator (SOI) structure, and a combination thereof. Further, substrate 102 can be doped with p-type dopants (e.g., boron (B), indium (In), aluminum (Al), or gallium (Ga)) or n-type dopants (e.g., phosphorus (P) or arsenic (As)). Substrate 102 can include transistor structures, such as field-effect transistors (FETs), planar FETs, finFETs, and gate-all-around (GAA) FETs. The FETs can include gate structures and source/drain (S/D) regions. Substrate 102 can include gate contacts and S/D contacts. Substrate 102 can further include interconnects, such as metal lines and metal vias. In some embodiments, substrate 102 can include multiple layers of interconnects, such as multiple metallization layers.

Dielectric layers 104 and 110 can include an insulating material, such as silicon oxide ($SiO_x$), silicon nitride (SiN), silicon carbon nitride (SiCN), silicon oxycarbon nitride (SiOCN), and silicon germanium oxide ($SiGeO_x$). Dielectric layer 104 can be an ILD layer. Dielectric layer 104 can be formed on substrate 102. Dielectric layer 110 can be formed within first passivation layer 108. In some embodiments, dielectric layer 110 can be titanium nitride (TiN) having a thickness of about 40 nm.

TME layer 106 can be interconnects, such as metal lines and metal vias. TME layer 106 can include a suitable conductive material, such as tungsten (W), titanium (Ti), silver (Ag), ruthenium (Ru), molybdenum (Mo), copper (Cu), cobalt (Co), Al, iridium (Ir), nickel (Ni), metal alloys, and a combination thereof. TME layer 106 can be formed on substrate 102 and within dielectric layer 104. Semiconductor structure 100 can include additional layers of dielectric layer 104 and TME layer 106. TME layer 106 can have a thickness between about 0.8 μm and about 1.3 μm.

First passivation layer 108 can include an insulating material, such as $SiO_x$, SiN, SiCN, SiOCN, and $SiGeO_x$. First passivation layer 108 can be formed on dielectric layer 104 and TME layer 106. First passivation layer 108 can have a varying thickness. For example, thickness H1 of first passivation layer 108 at a top point on a slanting slope at a corner between first passivation layer 108 and metal RDL 114 can be between about 1 μm and about 1.5 μm, between about 0.9 μm and about 2 μm, and between about 0.8 μm and about 2.5 μm. Thickness H2 of first passivation layer 108 at a middle point on the slanting slope at the corner between first passivation layer 108 and metal RDL 114 can be between about 0.8 μm and about 1.3 μm, between about 0.7 μm and about 1.4 μm, and between about 0.6 μm and about 1.5 μm. Thickness H3 of first passivation layer 108 at a bottom point on the slanting slope at the corner between first passivation layer 108 and metal RDL 114 can be between about 0.6 μm and about 1.1 μm, between about 0.5 μm and about 1.2 μm, and between about 0.4 μm and about 1.3 μm. The ratio between H1 and H2 can be between about 1.2 and about 1.3, between about 1.15 and about 1.35, and between about 1.1 and about 1.4. The ratio between H1 and H3 can be between about 1.4 and about 1.6, between about 1.35 and about 1.65, and between about 1.3 and about 1.7. If H1/H2 is greater than about 1.4 or if H1/H3 is greater than about 1.7, the slope between first passivation layer 108 and metal RDL 114 can be too slanted and cracks can occur around the corner. If H1/H2 is less than about 1.1 or if H1/H3 is less than about 1.3, metal RDL 114 can be over etched and electrical connection can be compromised.

Angle θ1 between a sidewall of metal RDL 114 and a top surface of first passivation layer 108 can be between about 105° and about 115°, between about 100° and about 125°, and between about 95° and about 135°. If θ1 is less than about 95°, the corner between first passivation layer 108 and metal RDL 114 can be too sharp and cracks can occur around the corner. If θ1 is greater than about 135°, metal RDL 114 can be over etched and electrical connection can be compromised. Angle θ2 between the sidewall of metal RDL 114 and the top surface of first passivation layer 108 can be between about 45° and about 85°, between about 55° and about 80°, and between about 65° and about 75°. The ratio between θ1 and θ2 can be between about 1.4 and about 1.6, between about 1.3 and about 1.7, and between about 1.2 and about 1.8. If θ1/θ2 is less than about 1.2, the corner between first passivation layer 108 and metal RDL 114 can be too sharp and cracks can occur around the corner. If θ1/θ2 is greater than about 1.8, metal RDL 114 can be over etched and electrical connection can be compromised.

MIM structure 112 can include an insulating layer interposed between two conductive layers. In some embodiments, the insulating layer can be aluminum oxide ($Al_2O_3$) having a thickness of about 2 nm. In some embodiments, the conductive layers can be the same material and can be a metal oxide, such as zirconium oxide ($ZrO_2$), having a thickness of about 2 nm. In some embodiments, the conductive layers can be different conductive materials, such as two metals, two metal oxides, and one metal and one metal oxide. MIM structure 112 can be formed within dielectric layer 110. MIM structure 112 can also be formed within first passivation layer 108 and dielectric layer 110. In some embodiments, MIM structure 112 can have a high capacitance density between about 2 fF/$\mu m^2$ and about 40 fF/$\mu m^2$. If cracks form at the corner between first passivation layer 108 and metal RDL 114, the cracks can propagate through first passivation layer 108 and damage MIM structure 112. Damaged MIM structure 112 can cause device failures. Rounded corners between first passivation layer 108 and metal RDL 114 can reduce cracks and reduce device failures.

Metal RDL 114 can include a suitable conductive material similar to that of TME layer 106. In some embodiments, metal RDL 114 can include Cu or Al. A bottom surface of metal RDL 114 can be in contact with a top surface of TME layer 106. Metal RDL 114 can be formed on first passivation layer 108 and portions of metal RDL 114 can be through first passivation layer 108 and dielectric layer 110. In some embodiments, portions of metal RDL 114 can be through MIM structure 112. Via width L1 of metal RDL 114 can be between about 1.5 μm and about 3 μm. Top width L2 of metal RDL 114 can be between about 5 μm and about 7 μm. Thickness H5 of metal RDL 114 can be between about 3 μm and about 7 μm. Distance between adjacent metal RDLs 114 can be at least about 6 μm. Bottom portions of metal RDL 114 can be rounded. In other words, corners between metal RDL 114 and first passivation layer 118 can be rounded. In some embodiments, sidewalls of metal RDL 114 are slanted from the top to the bottom and the slant can contribute to the rounded corner between metal RDL 114 and first passivation layer 118.

Barrier layer 113 can include any suitable material, such as a metal oxide ($MO_x$), a metal nitride ($MN_x$), a metal carbide ($MC_x$), a metalaluminate ($MAl_xO_y$), a combination of metal oxides ($M1O_x/M2O_x$), a metal-silicate ($MSiO_x$), and combinations thereof. In some embodiments, the metal in the above-mentioned materials is a transition metal, such as hafnium (Hf), zirconium (Zr), Ti, and Al, a rare earth metal, such as yttrium (Y), ytterbium (Yb), erbium (Er), and combinations thereof. By way of example and not limitation, barrier layer 113 can include zirconium oxide ($ZrO_x$). In some embodiments, barrier layer 113 can include zirconium-aluminum oxide (ZrAlO) with an Al concentration between about 10 atomic percent ("at. %") and about 25 at. %. In some embodiments, barrier layer 113 can include alternating layers of the aforementioned $ZrO_x$ and ZrAlO layers. In some embodiments, barrier layer 113 can include dielectric materials, such as SiN, SiOCN, SiCN, other suitable insulating materials, and any combination thereof. Barrier layer 113 can be formed on first passivation layer 118 and portions of barrier layer 113 can be through first passivation layer 118. In some embodiments, the thickness of barrier layer 113 can be between about 1 nm and about 10 nm. Corners between barrier layer 113 and first passivation layer 118 can also be rounded.

Second passivation layer 116 can include an insulating material, such as $SiO_x$, SiN, SiCN, SiOCN, and $SiGeO_x$. Second passivation layer 116 can have an insulating material different than that of first passivation layer 108. In some embodiments, second passivation layer 116 can have an insulating material similar to that of first passivation layer 108. Second passivation layer 116 can be formed on first passivation layer 108 and metal RDL 114. Rounded corners of first passivation layer 108 can carry over to second passivation layer 116. Therefore, second passivation layer 116 can also have a varying thickness. In some embodiments, second passivation layer 116 can have a substantially constant thickness resulting from a conformal deposition process. For example, thickness H4 of second passivation layer 116 can be between about 1 μm and about 1.5 μm. Second passivation layer 116 can carry over the rounded corners of first passivation layer 108 and continue to reduce crack formation around the corners between second passivation layer 116 and metal RDL 114.

Referring to FIG. 1B, third passivation layer 117 can include an insulating material, such as $SiO_x$, SiN, SiCN, SiOCN, and $SiGeO_x$. Third passivation layer 117 can have an insulating material different than that of first passivation layer 108 or second passivation layer 116. In some embodiments, third passivation layer 117 can have an insulating material similar to that of first passivation layer 108 or second passivation layer 116. Third passivation layer 117 can be formed on second passivation layer 116. Rounded corners of first passivation layer 108 and second passivation layer 116 can carry over to third passivation layer 117. Therefore, third passivation layer 117 can also have a varying thickness. In some embodiments, third passivation layer 117 can have a substantially constant thickness resulting from a conformal deposition process. For example, thickness H6 of third passivation layer 117 can be between about 1 μm and about 1.5 μm. Third passivation layer 117 can carry over the rounded corners of first passivation layer 108 and second passivation layer 116 and continue to reduce crack formation around the corners between third passivation layer 117 and metal RDL 114.

Referring to FIGS. 1A and 1B, polyimide layer 118 can include polyimide and can be formed on second passivation layer 116 or third passivation layer 117. Polyimide layer 118 can provide mechanical support to WLP structure 100 or InFO structure 100. Portions of polyimide layer 118, second passivation layer 116, and/or third passivation layer 117 can be removed to form a UBM opening to expose a top surface of metal RDL 114. The UBM opening can be slanted so that UBM structure 120 can adhere to polyimide layer 118 well. The thickness of polyimide layer 118 can be between about 10 μm and about 15 μm.

UBM structure 120 can include a conductive material similar to that of TME layer 106 and metal RDL 114. In some embodiments, UBM structure 120 can include Ti, Cu, or Ti/Cu alloy. UBM structure 120 can be formed on portions of polyimide layer 118. A portion of UBM structure 120 can be in contact with a top surface of metal RDL 114. Namely, UBM structure 120 is electrically coupled to TME layer 106 by metal RDL 114. The thickness of UBM structure 120 above polyimide layer 118 can be between about 1 μm and about 4 μm. UBM structure 120 can improve adhesion of metal bump 122, thus improving uniformity of forming metal bumps across a wafer in bumping processes.

Metal bump 122 can include a conductive material similar to that of TME layer 106, metal RDL 114, and UBM structure 120. In some embodiments, metal bump 122 can include Cu. Metal bump 122 can be formed on UBM structure 120. The thickness of metal bump 122 above UBM structure 120 can be between about 20 μm and about 45 μm.

Solder cap 124 can include a soldering material, such as tin (Sn). Solder cap 124 can be formed on metal bump 122. The thickness of solder cap 124 above metal bump 122 can be about 20 μm. The diameter of metal bump 122 and solder cap 124 can be between about 20 μm and about 50 μm. Bump space between adjacent metal bumps 122 can be between about 5 μm and about 30 μm. Bump pitch between adjacent metal bumps 122 can be between about 25 μm and about 80 μm. In some embodiments, there can be between about 7,000 and about 40,000 metal bumps 122 on a wafer.

Figure 2:
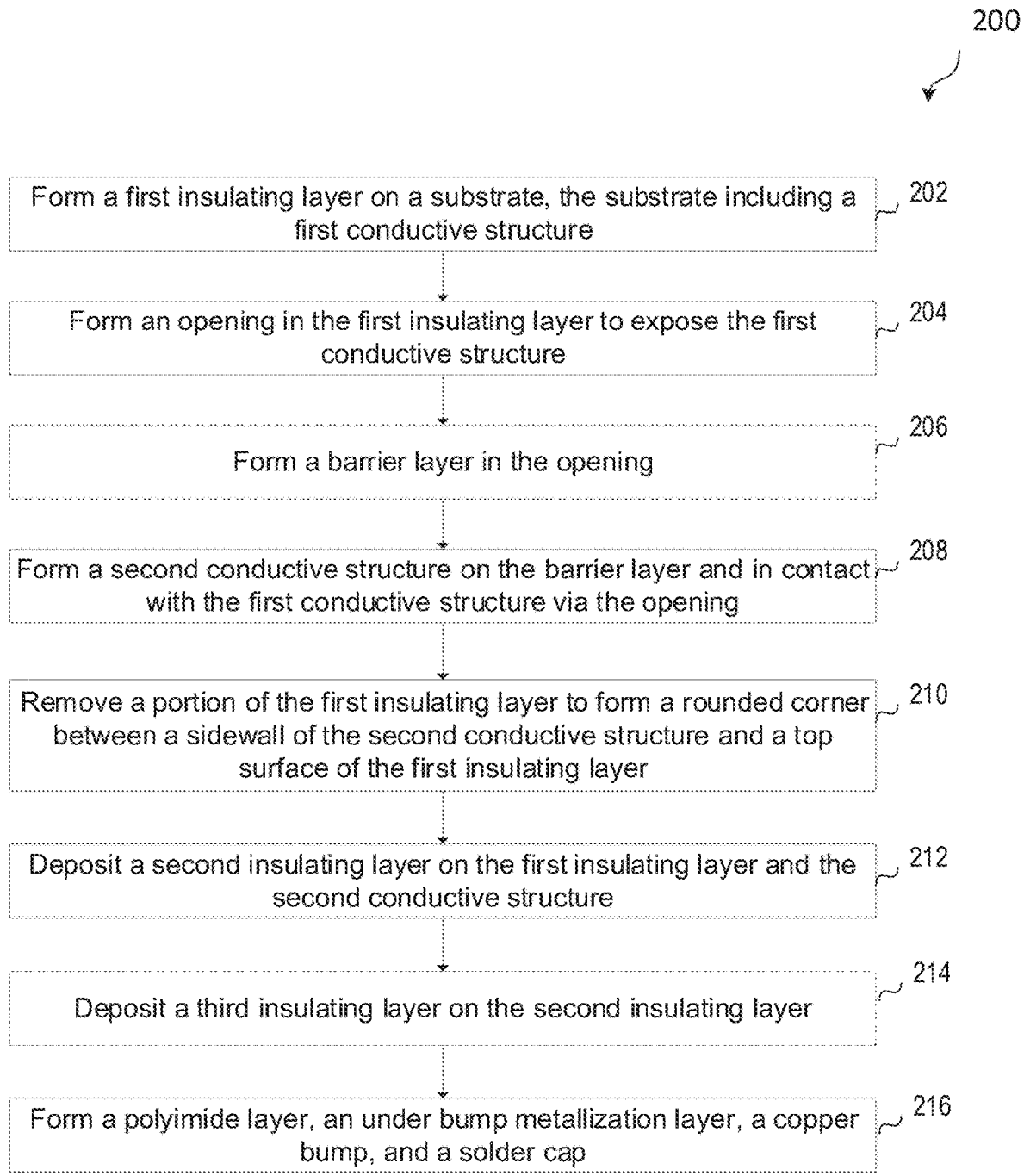
FIG. 2 is a flow diagram of a method for fabricating a semiconductor structure with passivation layers with rounded corners, in accordance with some embodiments.

According to some embodiments, FIG. 2 is a flow diagram of a method 200 for fabricating a semiconductor structure 100 as shown in FIGS. 1A and 1B. For illustrative purposes, the operations illustrated in FIG. 2 will be described with reference to the example fabrication process for fabricating semiconductor structure 100 as illustrated in FIGS. 3-5, 6A-6C, 7, 8A, 8B, 9A, and 9B. FIGS. 3-5, 6A-6C, 7, 8A, 8B, 9A, and 9B are enlarged views of region A in FIGS. 1A and 1B. Additional fabrication operations can be performed between the various operations of method 200 and are omitted for simplicity. These additional fabrication operations are within the spirit and the scope of this disclosure. Moreover, not all operations may be required to perform the disclosure provided herein. Additionally, some of the operations can be performed simultaneously, or in a different order than the ones shown in FIG. 2. Elements in FIGS. 3-5, 6A-6C, 7, 8A, 8B, 9A, and 9B with the same annotations as elements in FIGS. 1A and 1B are described above. It should be noted that method 200 may not produce a complete semiconductor structure 100. Accordingly, it is understood that additional processes can be provided before, during, and after method 200, and that some other processes may be briefly described herein.

Referring to FIG. 2, in operation 202, a first insulating layer can be formed on a substrate, where the substrate can include a first conductive structure. For example, as shown in FIG. 3, first passivation layer 108 can be formed on dielectric layer 104 and substrate 102. Substrate 102 can include transistors. In some embodiments, fin structures can be patterned by a photolithography process on a semiconductor substrate. Polysilicon structures can be deposited by a chemical vapor deposition (CVD) process over the fin structures and patterned by a photolithography process. Spacers can be deposited by a CVD process on the polysilicon structures. Portions of the fin structures can be removed by a dry etch process to form S/D openings, and S/D regions can be epitaxially grown in the S/D openings. In GAA FETs, inner spacers can be deposited by a CVD process prior to the S/D region formation. The polysilicon structures can then be removed by a dry etch process to form gate openings and gate structures can be formed in the gate openings. Gate dielectric layers, interfacial oxide (IO) layers, work-function metal (WFM) layers, and metal fill layers can be deposited by a CVD process, a physical vapor deposition (PVD) process, or a metal-organic chemical vapor deposition (MOCVD) process to form the gate structures. An etch stop layer (ESL) and an ILD layer can be deposited by a CVD process on the gate structures and the S/D regions. Gate contact openings and S/D contact openings can be formed in the ILD layer by a dry etch process. Gate contacts can be deposited in the gate contact openings and S/D contacts can be deposited in the S/D contact openings by a PVD process or a CVD process. In some embodiments, substrate 102 can include one or more interconnect layers. Each interconnect layer can include metal lines and metal vias embedded in a dielectric layer. Metal via openings and metal line openings can be formed by a dry etch process in the dielectric layer. The metal vias can be deposited in the metal via openings, and the metal lines can be deposited in the metal line openings by a MOCVD process, a sputtering process, or an electroplating process.

Dielectric layer 104 can be deposited on substrate 102 by a CVD process. Dielectric layer 104 can include TME layer 106. TME layer 106 can include top metal vias and top metal lines. Top metal via openings and top metal line openings can be formed by a dry etch process in dielectric layer 104. The top metal vias can be deposited in the top metal via openings and the top metal lines can be deposited in the top metal line openings by a MOCVD process, a sputtering process, or an electroplating process. First passivation layer 108 can be deposited on dielectric layer 104 by a CVD process or a PVD process. First passivation layer 108 can include dielectric layer 110 and MIM structure 112. Dielectric layer 110 can be deposited within first passivation layer 108 by a PVD process or a CVD process. The metal layers of MIM structure 112 can be deposited by an atomic layer deposition (ALD) process.

Referring to FIG. 2, in operation 204, an opening can be formed in the first insulating layer to expose the first conductive structure. For example, as shown in FIG. 4, opening 402 can be formed in first passivation layer 108 to expose TME layer 106. In some embodiments, opening 402 penetrates through dielectric layer 110 and MIM structure 112. In some embodiments, opening 402 can be formed by a dry etch process (e.g., reactive ion etching process) using fluorocarbon ($C_xF_y$) gas having a flow rate ranging from about 100 sccm to about 400 sccm. The etch process can be carried out for a period of time ranging from about 10 seconds to about 90 seconds at a temperature ranging from about 10° C. to about 90° C., under a pressure ranging from about 15 mTorr to about 100 mTorr. The etching conditions can depend on the size of opening 402. The etch process can have a higher etching rate in the vertical direction than in the horizontal direction. The etch process can have a higher etching rate near the top of opening 402 than near the bottom of opening 402. In some embodiments, opening 402 can be formed by a wet etch process using hydrogen peroxide at a temperature ranging from about 30° C. to about 100° C. In some embodiments, an ESL can be formed on TME layer 106 to stop the etching of opening 402. In some embodiments, TME layer 106 can function as an ESL.

Figure 5:
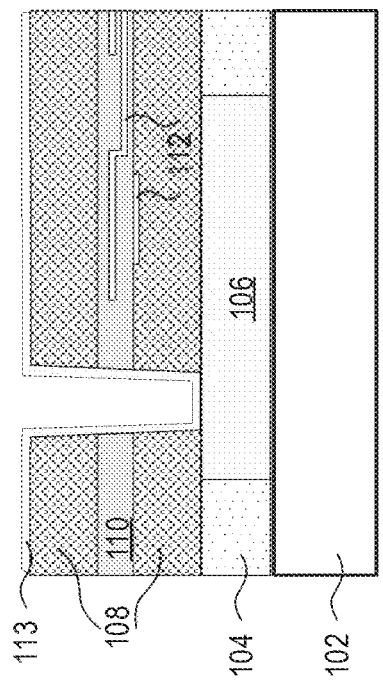

Referring to FIG. 2, in operation 206, a barrier layer can be formed in the opening. For example, as shown in FIG. 5, barrier layer 113 can be formed in opening 402. In some embodiments, barrier layer 113 can be deposited by thermal or plasma ALD methods. Alternative deposition methods, such as PECVD and CVD, can be used. Barrier layer 113 can improve adhesion of metal RDL 114.

Figure 6A:
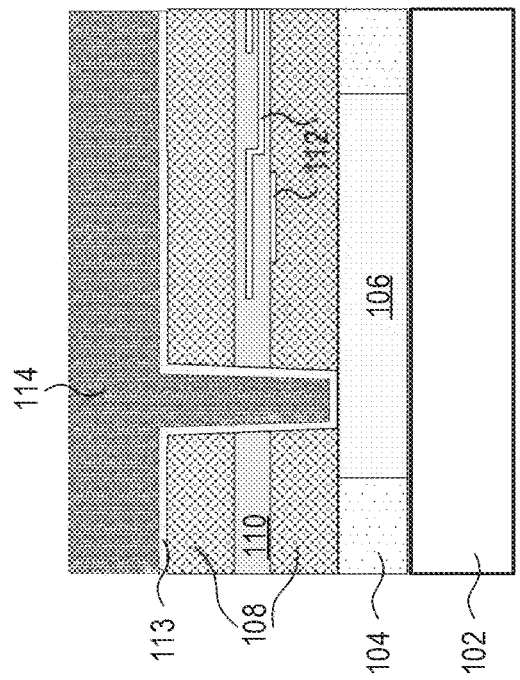
Figure 6B:
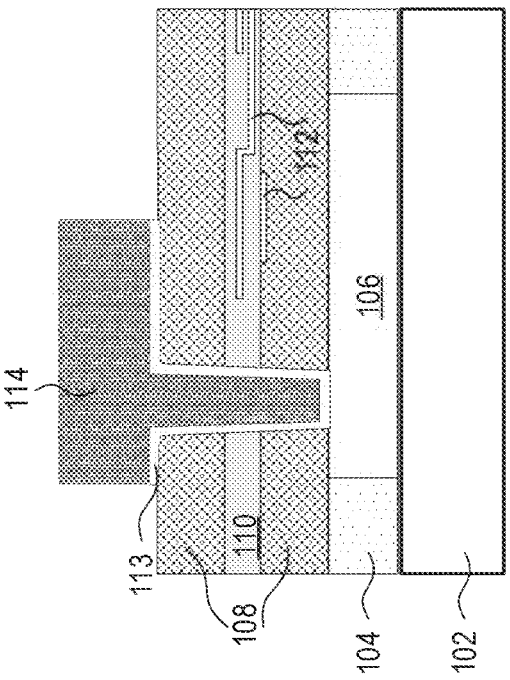
Figure 6C:
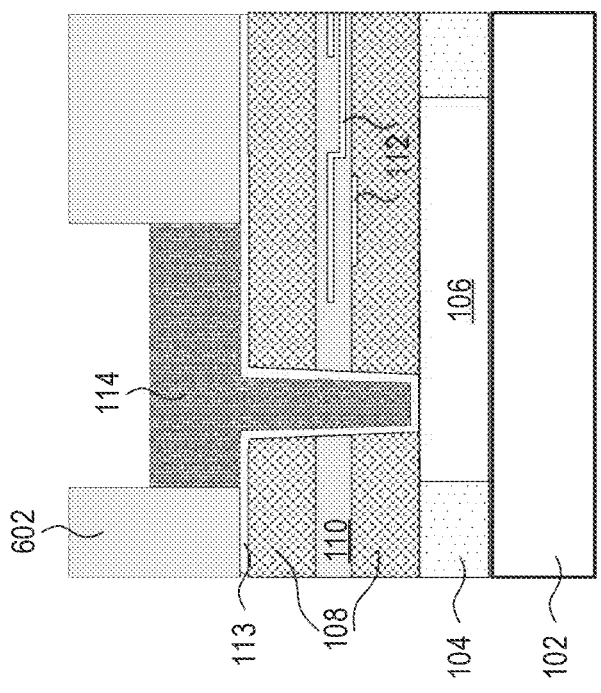

Referring to FIG. 2, in operation 208, a second conductive structure can be formed on the barrier layer and in contact with the first conductive structure via the opening. For example, as shown in FIG. 6A, metal RDL 114 can be formed on barrier layer 113 and in contact with TME layer 106 via opening 402. In some embodiments, metal RDL 114 can be in contact with TME layer 106 directly without barrier layer 113. Metal RDL 114 can be deposited on barrier layer 113 and in opening 402 by a MOCVD process, a sputtering process, or an electroplating process. Referring to FIG. 6B, in some embodiments, blocking layer 602, such as a photoresist layer, can be patterned on barrier layer 113. Blocking layer 602 can define a shape of metal RDL 114. Metal RDL 114 can be deposited in the openings defined by blocking layer 602 by a MOCVD process, a sputtering process, or an electroplating process. Referring to FIG. 6C, after blocking layer 602 is removed by stripping, a wet chemistry process, or a dry etch process, metal RDL 114 can remain. In some embodiments, barrier layer 113 exposed outside metal RDL 114 can also be removed during the removal of blocking layer 602. In some embodiments, Cu RDL 114 can be formed according to FIGS. 6B and 6C. In some embodiments, Al RDL 114 can be formed according to FIG. 6A.

Referring to FIG. 2, in operation 210, a portion of the first insulating layer can be removed to form a rounded corner between a sidewall of the second conductive structure and a top surface of the first insulating layer. For example, as shown in FIG. 7, a portion of first passivation layer 108 can be removed to form a rounded corner between a sidewall of metal RDL 114 and a top surface of first passivation layer 108. In some embodiments, this can be performed in a two-step etching process. A portion of metal RDL 114 and barrier layer 113 can be removed by a dry etch process with first etching conditions. If metal RDL 114 is formed according to the operation shown in FIG. 6A, a larger portion of metal RDL 114 needs to be removed to form the rounded corner in FIG. 7. If metal RDL 114 is formed according to the operations shown in FIGS. 6B and 6C, a smaller portion of metal RDL 114 needs to be removed to form the rounded corner in FIG. 7. Metal RDL 114 and barrier layer 113 can be etched in a dry etch process (e.g., reactive ion etching process) using a gas mixture having $C_xF_y$ gas, oxygen, nitrogen, and argon. The gas mixture can have about 5% to about 10% $C_xF_y$, and about 1% to about 5% oxygen. The flow rate of $C_xF_y$ can range from about 10 sccm to about 60 sccm. The flow rate of oxygen can range from about 5 sccm to about 30 sccm. The flow rate of nitrogen and argon can range from about 5 sccm to about 1000 sccm. The etch process can be carried out for a period of time ranging from about 10 seconds to about 90 seconds at a temperature ranging from about 10° C. to about 90° C., under a pressure ranging from about 15 mTorr to about 100 mTorr. The etch process can be anisotropic and result in a slanted slope near the bottom of metal RDL 114. In some embodiments, the entire sidewall of metal RDL 114 can be slanted.

A portion of first passivation layer 108 can be removed by a dry etch process with second etching conditions. First passivation layer 108 can be etched in a dry etch process (e.g., reactive ion etching process) using a gas mixture having hydrofluorocarbon ($C_xH_yF_z$) gas, oxygen, nitrogen, and argon. The gas mixture can have $C_xH_yF_z$ between about 5% and about 10%, between about 3% and about 15%, and between about 1% and about 20%. If the percentage of $C_xH_yF_z$ is less than about 1%, the corner between first passivation layer 108 and metal RDL 114 can be too sharp and cracks can occur around the corner. If the percentage of $C_xH_yF_z$ is greater than about 20%, metal RDL 114 can be over etched and electrical connection can be compromised. The gas mixture can have about 1% to about 5% oxygen. The flow rate of $C_xH_yF_z$ can range from about 5 sccm to about 100 sccm, between about 3 sccm and about 150 sccm, and between about 1 sccm and about 200 sccm. If the flow rate of $C_xH_yF_z$ is less than about 1 sccm, the corner between first passivation layer 108 and metal RDL 114 can be too sharp and cracks can occur around the corner. If the flow rate of $C_xH_yF_z$ is greater than about 200 sccm, metal RDL 114 can be over etched and electrical connection can be compromised. The flow rate of oxygen can range from about 5 sccm to about 30 sccm. The flow rate of nitrogen and argon may range from about 50 sccm to about 300 sccm. The etch process can be carried out for a period of time ranging from about 10 seconds to about 90 seconds, between about 5 seconds and about 150 seconds, and between about 2 seconds and about 250 seconds. If the time duration is less than about 2 seconds, the corner between first passivation layer 108 and metal RDL 114 can be too sharp and cracks can occur around the corner. If the time duration is greater than about 250 seconds, metal RDL 114 can be over etched and electrical connection can be compromised. The etch process can be carried out at a temperature ranging from about 10° C. to about 90° C., between about 5° C. and about 200° C., and between about 2° C. and about 300° C. If the temperature is less than about 2° C., the corner between first passivation layer 108 and metal RDL 114 can be too sharp and cracks can occur around the corner. If the temperature is greater than about 300° C., metal RDL 114 can be over etched and electrical connection can be compromised. The etch process can be carried out under a pressure ranging from about 15 mTorr to about 100 mTorr, between about 10 mTorr and about 200 mTorr, and between about 5 mTorr and about 300 mTorr. If the pressure is less than about 5 mTorr, the corner between first passivation layer 108 and metal RDL 114 can be too sharp and cracks can occur around the corner. If the pressure is greater than about 300 mTorr, metal RDL 114 can be over etched and electrical connection can be compromised. The etch process can be anisotropic and result in more etch near the corner between first passivation layer 108 and metal RDL 114. The rounded corner between first passivation layer 108 and metal RDL 114 can reduce crack formation, thus improving device reliability.

Referring to FIG. 2, in operation 212, a second insulating layer can be deposited on the first insulating layer and the second conductive structure. For example, as shown in FIG. 8A, second passivation layer 116 can be deposited on first passivation layer 108 and metal RDL 114. Second passivation layer 116 can be deposited by a CVD process, a plasma-enhanced chemical vapor deposition (PECVD) process, or a PVD process. The deposition can be conformal, and the rounded corners between first passivation layer 108 and metal RDL 114 can be carried over to second passivation layer 116.

Figure 8B:
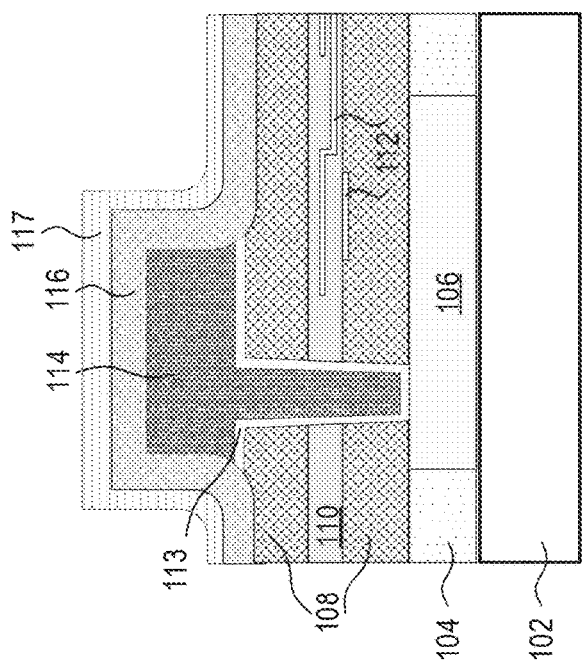

Referring to FIG. 2, in operation 214, in some embodiments, a third insulating layer can be deposited on the second insulating layer. For example, as shown in FIG. 8B, third passivation layer 117 can be deposited on second passivation layer 116. Third passivation layer 117 can be deposited by a CVD process, a PECVD process, or a PVD process. The deposition can be conformal, and the rounded corners between first passivation layer 108 and metal RDL 114 can be carried over to third passivation layer 117.

Figure 9A:
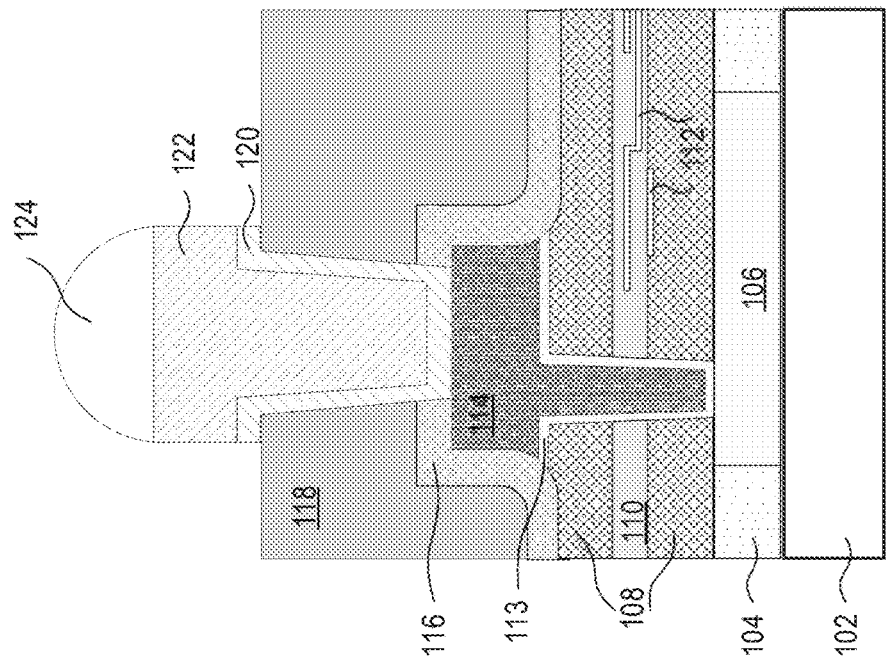
Figure 9B:
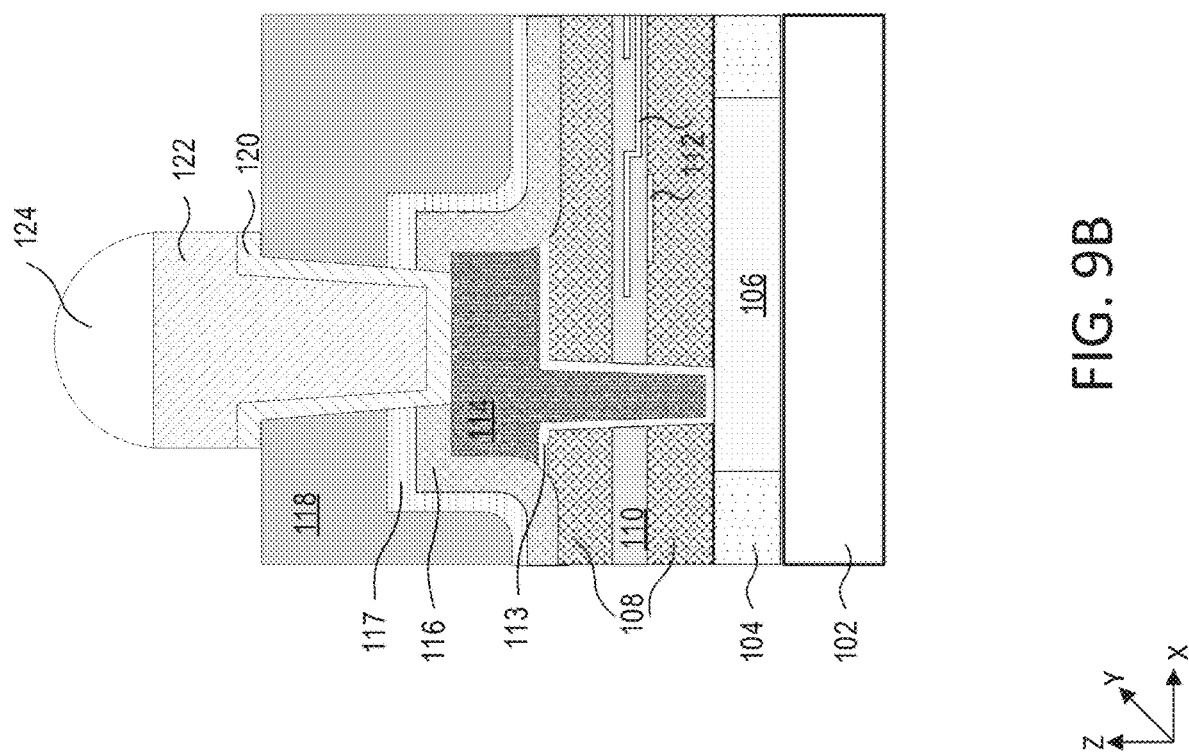

Referring to FIG. 2, in operation 216, a polyimide layer, a UBM structure, a metal bump, and a solder cap can be formed. For example, as shown in FIGS. 9A and 9B, polyimide layer 118, UBM structure 120, metal bump 122, and solder cap 124 can be formed. A polyimide photoresist can be spin coated on second passivation layer 116 or third passivation layer 117. The polyimide photoresist can be exposed to a radiation source, such as an ultraviolet (UV), extreme ultraviolet (EUV), and deep ultraviolet (DUV) radiation source, through a photomask. The photomask can have patterns that are associated with shapes, sizes, and locations of UBM openings to be formed in polyimide layer 118. After the exposure, the polyimide photoresist can be developed so that the UBM openings can be formed. In some embodiments, there can be a pre-exposure anneal process, a post-exposure anneal process, and a post-develop anneal process to improve the mechanical strength of polyimide layer 118. Once the UBM openings are formed, second passivation layer 116 and/or third passivation layer 117 exposed by the UBM openings can be etched by a dry etch process or a wet etch process to expose a top surface of metal RDL 114. In some embodiments, a portion of second passivation layer 116 and/or third passivation layer 117 can be etched by a dry etch process or a wet etch process to expose a top surface of metal RDL 114. Polyimide layer 118 can be formed with UBM openings coinciding with the removed portions of second passivation layer 116 and/or third passivation layer 117.

UBM structure 120 can be formed by a CVD process, a PECVD process, a MOCVD process, a PVD process, or a sputtering process. Metal bump 122 can be formed by a PVD process, a sputtering process, or an electroplating process. Solder cap 124 can be formed by a soldering process.

The present disclosure provides example semiconductor structures (e.g., structures 100, WLP structures 100, and InFO structures 100) with passivation layers (e.g., passivation layers 108, 116, and 117) with rounded corners and a method (e.g., method 200) for forming the passivation layers with rounded corners. A first passivation layer (e.g., first passivation layer 108) can be formed on an interlayer dielectric (ILD) layer (e.g., ILD layer 104) formed on a substrate (e.g., substrate 102). The substrate can include transistors, contacts, and metallization layers. The ILD layer can include a top metallization (TME) layer (e.g., TME layer 106). The first passivation layer can include MIM structures (e.g., MIM structure 112). An opening (e.g., opening 402) can be formed in the first passivation layer. A metal RDL (e.g., metal RDL 114) can be formed in the opening. In some embodiments, a barrier layer (e.g., barrier layer 113) can be formed before the metal RDL is formed. A portion of the metal RDL and the barrier layer can be removed by first etching conditions. The first etch can be anisotropic. For example, after the first etch, a sidewall of the metal RDL can be substantially vertical near the top but the sidewall can be slanted near the bottom. In some embodiments, the sidewall of the metal RDL can be slanted from the top to the bottom. In some embodiments, a blocking layer (e.g., blocking layer 602), such as a photoresist layer, can be used to define a shape of the metal RDL. After the blocking layer is removed, less metal RDL needs to be removed by the first etching conditions compared with the embodiment where no blocking layer is used.

A portion of the first passivation layer can be removed by second etching conditions, different from the first etching conditions. The second etch can be anisotropic. For example, after the second etch, a corner between a sidewall of the metal RDL and a top surface of the first passivation layer can be rounded but the top surface of the first passivation layer can be substantially flat farther from the corner. In some embodiments, the top surface of the first passivation layer can be slanted farther from the corner. In some embodiments, the corner between the sidewall of the metal RDL and the top surface of the first passivation layer can be between about 95° and about 135°. The rounded corners can reduce the formation of cracks. Less cracks can form and propagate into the MIM structures in the first passivation layer.

A second passivation layer (e.g., second passivation layer 116) can be formed on the first passivation layer and carry over the rounded corners to the second passivation layer. In some embodiments, a third passivation layer (e.g., third passivation layer 117) can be formed on the second passivation layer and carry over the rounded corners to the third passivation layer. The rounded corners within different passivation layers can reduce the cracks. A polyimide layer (e.g., polyimide layer 118) can be formed on the second passivation layer or the third passivation layer. A UBM opening can be formed through the polyimide layer, the second passivation layer, and/or the third passivation layer. A UBM structure (e.g., UBM structure 120) can be formed in the UBM opening. A metal bump (e.g., metal bump 122) can be formed on the UBM structure and a solder cap (e.g., solder cap 124) can be attached to the metal bump. The rounded corners can also reduce delamination of the polyimide layer and the UBM structure, further improving device reliability. The passivation layers with rounded corners can reduce MIM and delamination defects, thus increasing reliability and lifetime of the WLP and InFO structures.

In some embodiments, a method includes forming a first insulating layer on a substrate, where the substrate includes a first conductive structure. The method further includes forming an opening in the first insulating layer to expose the first conductive structure and forming a second conductive structure on the first insulating layer, where the second conductive structure is in contact with the first conductive structure through the opening. The method further includes removing a portion of the second conductive structure with a first etching condition, removing a portion of the first insulating layer with a second etching condition, different from the first etching condition, to form a rounded corner between a sidewall of the second conductive structure and a top surface of the first insulating layer, and depositing a second insulating layer on the first insulating layer and the second conductive structure.

In some embodiments, a method includes forming a first insulating layer on a top metallization (TME) layer disposed within a substrate and forming a conductive structure on the first insulating layer and in contact with the TME layer through the first insulating layer. The method further includes etching a portion of the conductive structure with a first etching condition and etching a portion of the first insulating layer with a second etching condition, different from the first etching condition, to form an angle, from about 95° to about 135°, between a sidewall of the conductive structure and a top surface of the first insulating layer. The method further includes depositing a second insulating layer on the first insulating layer and the conductive structure, forming a polyimide layer on the second insulating layer, and forming a metal bump on the polyimide layer and in contact with the conductive structure through the polyimide layer and the second insulating layer.

In some embodiments, a structure includes a first insulating layer disposed on a substrate including a top metallization (TME) layer and a conductive structure disposed on the first insulating layer and in contact with the TME layer through the first insulating layer, where an angle between a sidewall of the conductive structure and a top surface of the first insulating layer is between about 95° and about 135°. The structure further includes a second insulating layer disposed on the first insulating layer and the conductive structure, a polyimide layer disposed on the second insulating layer, and a metal bump disposed on the polyimide layer and in contact with the conductive structure through the polyimide layer and the second insulating layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first insulating layer on a substrate, wherein the substrate comprises a first conductive structure;
   forming an opening in the first insulating layer to expose the first conductive structure;
   forming a second conductive structure on the first insulating layer, wherein the second conductive structure is in contact with the first conductive structure through the opening;
   removing a portion of the second conductive structure with a first etching condition to form a rounded sidewall in a bottom portion of the second conductive structure;
   removing a portion of the first insulating layer with a second etching condition, different from the first etching condition, to form a rounded corner between a sidewall of the second conductive structure and a top surface of the first insulating layer; and
   depositing a second insulating layer on the first insulating layer and the second conductive structure.

2. The method of claim 1, further comprising forming a metal-insulator-metal (MIM) structure within the first insulating layer.

3. The method of claim 1, wherein removing the portion of the first insulating layer to form the rounded corner comprises forming an angle, from about 95° to about 135°, between the sidewall of the second conductive structure and the top surface of the first insulating layer.

4. The method of claim 1, further comprising:
   forming a barrier layer between the first insulating layer and the second conductive structure; and
   removing a portion of the barrier layer with the first etching condition.

5. The method of claim 1, wherein the second conductive structure comprises a copper redistribution layer (RDL), and wherein forming the second conductive structure comprises forming a blocking layer to define a shape of the copper RDL.

6. The method of claim 1, wherein the second conductive structure comprises an aluminum RDL, and wherein the method further comprises depositing a third insulating layer on the second insulating layer.

7. The method of claim 1, wherein removing the portion of the first insulating layer to form the rounded corner comprises removing the portion of the first insulating layer by a dry etch process.

8. The method of claim 1, wherein removing the portion of the first insulating layer to form the rounded corner comprises etching the portion of the first insulating layer using a hydrofluorocarbon gas, and wherein a flow rate of a fluorocarbon gas is between about 10 sccm and about 60 sccm.

9. The method of claim 1, further comprising:
   forming a polyimide layer on the second insulating layer;
   forming an other opening in the polyimide layer and the second insulating layer to expose the second conductive structure; and
   forming a metal bump on the polyimide layer, wherein the metal bump is in contact with the second conductive structure through the other opening.

10. The method of claim 9, further comprising:
    forming an under bump metallization (UBM) structure in the other opening; and
    forming a solder cap on the metal bump.

11. A method, comprising:
    forming a first insulating layer on a top metallization (TME) layer disposed within a substrate;
    forming a conductive structure on the first insulating layer and in contact with the TME layer through the first insulating layer;
    etching a portion of the conductive structure with a first etching condition;
    etching a portion of the first insulating layer with a second etching condition, different from the first etching condition, to form an angle, from about 95° to about 135°, between a sidewall of the conductive structure and a top surface of the first insulating layer;
    depositing a second insulating layer on the first insulating layer and the conductive structure;
    forming a polyimide layer on the second insulating layer; and
    forming a metal bump on the polyimide layer and in contact with the conductive structure through the polyimide layer and the second insulating layer.

12. The method of claim 11, further comprising forming a metal-insulator-metal (MIM) structure within the first insulating layer.

13. The method of claim 11, further comprising:
    forming a barrier layer between the first insulating layer and the conductive structure; and
    removing a portion of the barrier layer with the first etching condition.

14. The method of claim 11, wherein the conductive structure comprises a copper redistribution layer (RDL), and wherein forming the conductive structure comprises forming a blocking layer to define a shape of the copper RDL.

15. The method of claim 11, wherein the conductive structure comprises an aluminum RDL, and wherein the method further comprises depositing a third insulating layer on the second insulating layer.

16. The method of claim 11, wherein etching the portion of the first insulating layer to form the angle comprises etching the portion of the first insulating layer using a gas mixture of a hydrofluorocarbon gas, oxygen, nitrogen, and argon, and wherein the gas mixture comprises between about 5% and about 10% hydrofluorocarbon gas.

17. A method, comprising:
    forming a first insulating layer on a substrate, wherein the substrate comprises a first conductive structure;
    etching an opening in the first insulating layer to expose the first conductive structure;
    forming a second conductive structure on the first insulating layer, wherein the second conductive structure is in contact with the first conductive structure through the opening;
    removing a portion of the first insulating layer to form a first rounded corner between a sidewall of the second conductive structure and a top surface of the first insulating layer; and
    depositing a second insulating layer on the first insulating layer and the second conductive structure, wherein a top surface and a side surface of the second insulating layer form a second rounded corner.

18. The method of claim 17, wherein removing the portion of the first insulating layer to form the first rounded corner comprises etching the portion of the first insulating layer using a hydrofluorocarbon gas, and wherein a flow rate of a fluorocarbon gas is between about 10 sccm and about 60 ccm.

19. The method of claim 17, wherein removing the portion of the first insulating layer to form the first rounded corner comprises etching the portion of the first insulating layer using a gas mixture of a hydrofluorocarbon gas, oxygen, nitrogen, and argon, and wherein the gas mixture comprises between about 5% and about 10% hydrofluorocarbon gas.

20. The method of claim 17, further comprising:
- depositing a polyimide layer on the second insulating layer;
- etching an opening in the polyimide layer and the second insulating layer to expose to the second conductive structure;
- depositing an under bump metallization (UBM) layer on the exposed second conductive structure;
- forming a metal bump on the UBM layer; and
- forming a solder cap on the metal bump.

\* \* \* \* \*